INDIRECT FREQUENCY MULTIPLICATION SYSTEM
Filed Jan. 19, 1972
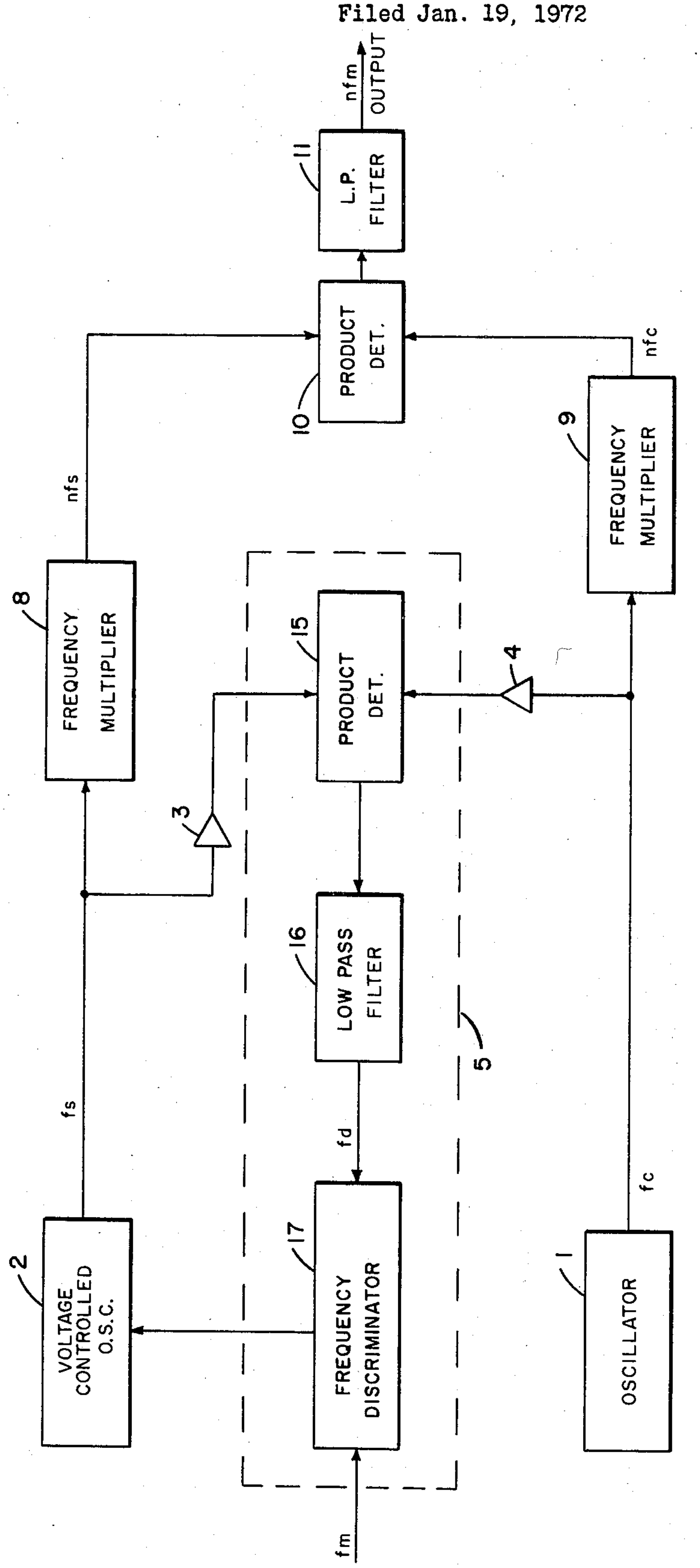

United States Patent Office 3,706,048
Patented Dec. 12, 1972

3,706,048

INDIRECT FREQUENCY MULTIPLICATION SYSTEM

Stephen L. Johnston, Huntsville, Ala., assignor to the United States of America as represented by the Secretary of the Army Filed Jan. 19, 1972, Ser. No. 218,966
Int. Cl. H03b *19/00*
U.S. Cl. 331—53 3 Claims

ABSTRACT OF THE DISCLOSURE

The frequencies of a controlled oscillator and a fixed oscillator are sensed by a product detector, and the difference is sent to a frequency discriminator along with the frequency to be multiplied. The difference between these two frequencies determines the output of the frequency discriminator which is fed to control the controlled oscillator. The outputs of both oscillators are multiplied and their multiplied results are subtracted to produce the desired output.

SUMMARY OF THE INVENTION

The frequency output of a fixed oscillator is passed through an isolating amplifier to one input of a frequency mixer or product detector. Similarly the output frequency of a voltage controlled oscillator is passed through an isolation amplifier to a further input of the product detector. The product detector mixes the frequencies and produces frequencies which are the difference and the sum of its two inputs. A filter is provided at the product detector's output so as to only pass the frequency difference to the frequency discriminator. The input signal, which is the frequency to be multiplied, is also fed to the frequency discriminator.

The output of the frequency discriminator is a DC voltage which is proportional to the frequency difference between the filtered output of the product detector and the signal to be multiplied. This voltage is fed to the variable frequency controlled oscillator to cause its output frequency to be equal to the frequency of the oscillator plus the frequency of the input signal (or the frequency of fixed oscillator minus the frequency of the input signal as desired); therefore the frequency output of the controlled oscillator is a synthetic single sideband signal which exists separately from the fixed oscillator's output and the input frequency and may be multiplied separately.

Two multipliers are provided to multiply the output of the variable frequency controlled oscillator and the fixed frequency oscillator. The output of these multipliers are mixed in a further frequency mixer or product detector. A further filter at the output of this product detector passes only the difference frequency output. From this it can be seen that the final output is a frequency which is a multiple $n$ of the input signal frequency, since the inputs to the final product detector are $n$ times the frequency of the variable frequency oscillator and $n$ times the frequency of the fixed frequency oscillator.

BRIEF DESCRIPTION OF THE DRAWING

The single figure is a schematic showing of the preferred embodiment of the invention.

DESCRIPTION OF THE PREFERRED EMBODIMENT

The figure shows a fixed frequency reference oscillator 1 having an output frequency of $fc$. A voltage controlled oscillator 2 having output frequency of $fs$. Voltage controlled oscillator 2 can be any of the well known oscillators which have a frequency output which is dependent on the magnitude of a DC voltage applied to its control input. The output of the oscillators 1 and 2 are fed through isolating amplifiers 3 and 4 to a detector 5. The signal frequency or input frequency $fm$ to be multiplied is also fed to the detector 5. The output of detector 5 will be a DC voltage which will control variable controlled oscillator 2 so that its output will be equal to the frequency of oscillator 1 ($fc$) plus (or minus) the input frequency $fm$.

Normally the frequency to be multiplied is a low, variable frequency source and cannot be multiplied directly through a frequency multiplier without distortion. However, the frequency of control oscillator 2 is a synthetic sideband signal which exists separately from the input frequency and from the frequency of oscillator 1. Since the oscillator 2 is a high frequency source it may be directly multiplied by a frequency multiplier 8 without any distortion of the signals. The frequency output of oscillator 1 is also multiplied by multiplier 9. The outputs of these multiplied frequencies are fed to a product detector or frequency mixer 10 whose output will be the frequency sum and the frequency difference of the inputs. A low pass filter 11 will select the frequency difference which will be a multiple of the input signal $fm$. This is so because the output of voltage control oscillator 2 ($fs$) is equal to $fc$ plus (or minus) $fm$, which are multiplied by frequency 8 to become $nfc$ plus (or minus) $nfm$. Therefore, when product detector 10 substracts $nfc$ from the frequency output of frequency multiplier 8, one is left with $nfm$.

The detector 5 may take the shape of the device disclosed in copending application AMPC 2819, Ser. No. 218,772, filed Jan. 18, 1972 by Stephen L. Johnston entitled "Frequency Discriminators With Variable Center Frequency." Discriminator 17 could be two Freq/DC converters having inputs connected respectively to filter 16 and input signal $fm$. The outputs of the converters connected to different inputs of a differential amplifier whose output would be the output of the discriminator (all not shown).

Frequency product detector 15 has inputs from the oscillators 1 and 2 by way of amplifiers 3 and 4. Output of product detector will be the sum and the difference of the frequencies of these inputs. The product detectors 15 and 10 may take the form of any of the well known frequency mixing devices. A low pass filter 16 filters out the sum frequency and pass the frequency difference $fd$ to frequency discriminator 17. The input signal $fm$ is also fed to frequency discriminator 17 which will have a DC output proportional to the frequency difference between $fd$ and $fm$.

This output is connected to the controlled input of variable control oscillator 2 to cause the oscillator to increase its frequency. If desired, the polarity could be such that the output would cause controlled oscillator 2 to decrease its frequency, as the same result would be obtained. The frequency of control oscillator 2 is initially close to the same frequency as that of oscillator 1. When its frequency increases, the frequency difference produced by product detector 15 will increase, thereby causing the $fd$ to approach the frequency of $fm$ at which time the output of frequency discriminator 17 will be zero. When this is obtained the frequency of oscillator 2 will be $fc$ plus $fm$ (or $fc$ minus $fm$) and the system will operate as described above.

I claim:

1. A frequency multiplier comprising first and second oscillator means; said first oscillator having its output frequency controlled in accordance with voltage impressed upon its control input; a first frequency to be multiplied; detector means having three inputs and an output; the outputs of said first and second oscillator means and said first frequency being connected to the inputs of said detector means; the output of the detector means being connected to the control input of the first oscillator; said deector means causing the output of said first oscillator to have a frequency output which is differlent from the frequency output of the second oscillator by an amount equal to the frequency of the first frequency to be multiplied; first and second frequency multipliers having their inputs connected correspondingly to the outputs of said first and second oscillator means; and frequency mixing means having inputs connected to the outputs of said frequency multipliers such that it will have an output which is a multiple of said first frequency.

2. A frequency multiplier as set forth in claim 1 further comprising a low pass filter connected to the output of said mixing means.

3. A frequency multiplier as set forth in claim 2 further comprising first and second isolating amplifiers connected between said first and second oscillators and said detecting means.

References Cited

UNITED STATES PATENTS 3,223,928 12/1965 Fayman ............ 331—53

JOHN KOMINSKI, Primary Examiner

U.S. Cl. X.R.

179—15.55; 325—433; 324—69; 328—16; 329—140; 331—40